United States Patent
Fukasawa et al.

(10) Patent No.: US 12,183,648 B2
(45) Date of Patent: Dec. 31, 2024

(54) SEMICONDUCTOR DEVICE AND SEMICONDUCTOR MODULE

(71) Applicant: Murata Manufacturing Co., Ltd., Kyoto-fu (JP)

(72) Inventors: Mikiko Fukasawa, Nagaokakyo (JP); Satoshi Goto, Nagaokakyo (JP); Shunji Yoshimi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 586 days.

(21) Appl. No.: 17/554,043

(22) Filed: Dec. 17, 2021

(65) Prior Publication Data
US 2022/0199484 A1 Jun. 23, 2022

(30) Foreign Application Priority Data
Dec. 18, 2020 (JP) .................. 2020-210056

(51) Int. Cl.
*H03F 3/14* (2006.01)
*H01L 23/367* (2006.01)
*H01L 23/66* (2006.01)
*H03F 3/195* (2006.01)

(52) U.S. Cl.
CPC ............ *H01L 23/367* (2013.01); *H01L 23/66* (2013.01); *H03F 3/195* (2013.01); *H01L 2223/6611* (2013.01); *H01L 2223/665* (2013.01); *H01L 2223/6655* (2013.01); *H01L 2223/6677* (2013.01); *H03F 2200/294* (2013.01); *H03F 2200/451* (2013.01)

(58) Field of Classification Search
CPC ............... H01L 23/367; H01L 23/66; H01L 2223/6611; H01L 2223/665; H01L 2223/6655; H01L 2223/6677; H01L 27/0248; H01L 23/5283; H01L 2924/3011; H03F 3/195; H03F 2200/294; H03F 2200/451; H03F 2200/111; H03F 2203/7209; H03F 3/68; H03F 3/72; H03F 1/30; H03F 3/19; H03F 3/14; H03F 3/187
USPC ........................................... 330/307
See application file for complete search history.

(56) References Cited

U.S. PATENT DOCUMENTS

| | | | |
|---|---|---|---|
| 10,262,875 B2 * | 4/2019 | Kogure | H01L 21/50 |
| 10,972,593 B1 * | 4/2021 | Sawada | H04M 1/0277 |
| 2015/0303971 A1 | 10/2015 | Reisner et al. | |
| 2016/0072456 A1 * | 3/2016 | Lin | H03F 3/191 |
| | | | 330/303 |
| 2020/0006536 A1 * | 1/2020 | Sasaki | H03F 3/19 |

* cited by examiner

*Primary Examiner* — Khanh V Nguyen
(74) *Attorney, Agent, or Firm* — Studebaker & Brackett PC

(57) ABSTRACT

In a semiconductor device, when a first surface of a first member is viewed in plan, a plurality of circuit blocks are disposed in an inner region of the first surface. The second member is joined to the first surface of the first member in surface contact with the first surface. The second member includes one or more circuit blocks. A conductive protrusion protrudes from the second member on an opposite side to the first member. One of the circuit blocks in the second member constitutes a first amplifier circuit including a plurality of first transistors that are connected in parallel to each other. At least one of the circuit blocks in the first member overlaps at least one circuit block in the second member in a plan view.

6 Claims, 11 Drawing Sheets

SEMICONDUCTOR DEVICE AND SEMICONDUCTOR MODULE

CROSS-REFERENCE TO RELATED APPLICATION

This application claims benefit of priority to Japanese Patent Application No. 2020-210056, filed Dec. 18, 2020, the entire content of which is incorporated herein by reference.

BACKGROUND

Technical Field

The present disclosure relates to a semiconductor device and a semiconductor module.

Background Art

Radio-frequency (RF) front-end modules with integrated functions of transmitting and receiving radio-frequency signals are installed in electronic devices for communications such as mobile communications and satellite communications. An RF front-end module includes, for example, a monolithic microwave integrated circuit (MMIC) with a function of amplifying radio-frequency signals, a control integrated circuit (IC) for controlling a radio-frequency amplifier circuit, a switch IC, and a duplexer.

U.S. Patent Application Publication No. 2015/0303971 discloses a radio-frequency module that is miniaturized by stacking a control IC on an MMIC. The radio-frequency module disclosed in U.S. Patent Application Publication No. 2015/0303971 includes the MMIC mounted on a module substrate and the control IC stacked on the MMIC. Electrodes of the MMIC, electrodes of the control IC, and electrodes on the module substrate are electrically connected to each other by wire bonding.

SUMMARY

For example, a heterojunction bipolar transistor (HBT) is utilized in a radio-frequency amplifier circuit. During operation of an HBT, the HBT generates heat because collector dissipation occurs. A temperature rise of the HBT caused by heat generation in turn increases a collector current. When conditions for this positive feedback are satisfied, thermal runaway occurs in the HBT. To avoid the thermal runaway in the HBT, an upper limit of output power of the HBT is restricted.

To increase a power output of the radio-frequency amplifier circuit, it is desirable to improve the characteristics of heat dissipation from a semiconductor device including an HBT and so on. The radio-frequency module disclosed in U.S. Patent Application Publication No. 2015/0303971 is difficult to satisfy a recent demand for radio-frequency amplifier circuits with high power outputs.

Accordingly, the present disclosure provides a semiconductor device and a semiconductor module each of which can improve the characteristics of heat dissipation.

According to one aspect of the present disclosure, a semiconductor device includes a first member having a first surface and including a plurality of circuit blocks disposed in an inner region of the first surface when the first surface is viewed in plan, a second member joined to the first surface of the first member in surface contact with the first surface, the second member including one or more circuit blocks, and a conductive protrusion protruding from the second member on an opposite side to the first member. One of the circuit blocks in the second member constitutes a first amplifier circuit including a plurality of first transistors that are connected in parallel to each other, and at least one of the circuit blocks in the first member overlaps at least one circuit block in the second member in a plan view.

According to another aspect of the present disclosure, a semiconductor module includes a first member having a first surface and including a plurality of circuit blocks disposed in an inner region of the first surface when the first surface is viewed in plan, a second member joined to the first surface of the first member in surface contact with the first surface, the second member including one or more circuit blocks, a first conductive protrusion protruding from the first surface of the first member, a second conductive protrusion protruding from the second member in the same direction as the first conductive protrusion, and a module substrate on which the first member and the second member are mounted, wherein one of the circuit blocks in the second member constitutes a first amplifier circuit including a plurality of first transistors that are connected in parallel to each other. At least one of the circuit blocks in the first member overlaps at least one circuit block in the second member in a plan view, and the circuit block in the first member and the circuit block in the second member, those circuit blocks overlapping in a plan view, are connected to each other via the first conductive protrusion, the second conductive protrusion, and a wiring disposed in or on the module substrate.

Heat generated from the first transistors is transferred through two heat transfer paths, namely a heat transfer path extending from the first transistors to the first member and a heat transfer path through the conductive protrusion. As a result, the characteristics of heat dissipation from the first transistors can be improved.

DETAILED DESCRIPTION

First Embodiment

A semiconductor device according to a first embodiment will be described below with reference to FIGS. 1 to 7D. The semiconductor device according to the first embodiment described below is a radio-frequency power amplifier.

Figure 1:
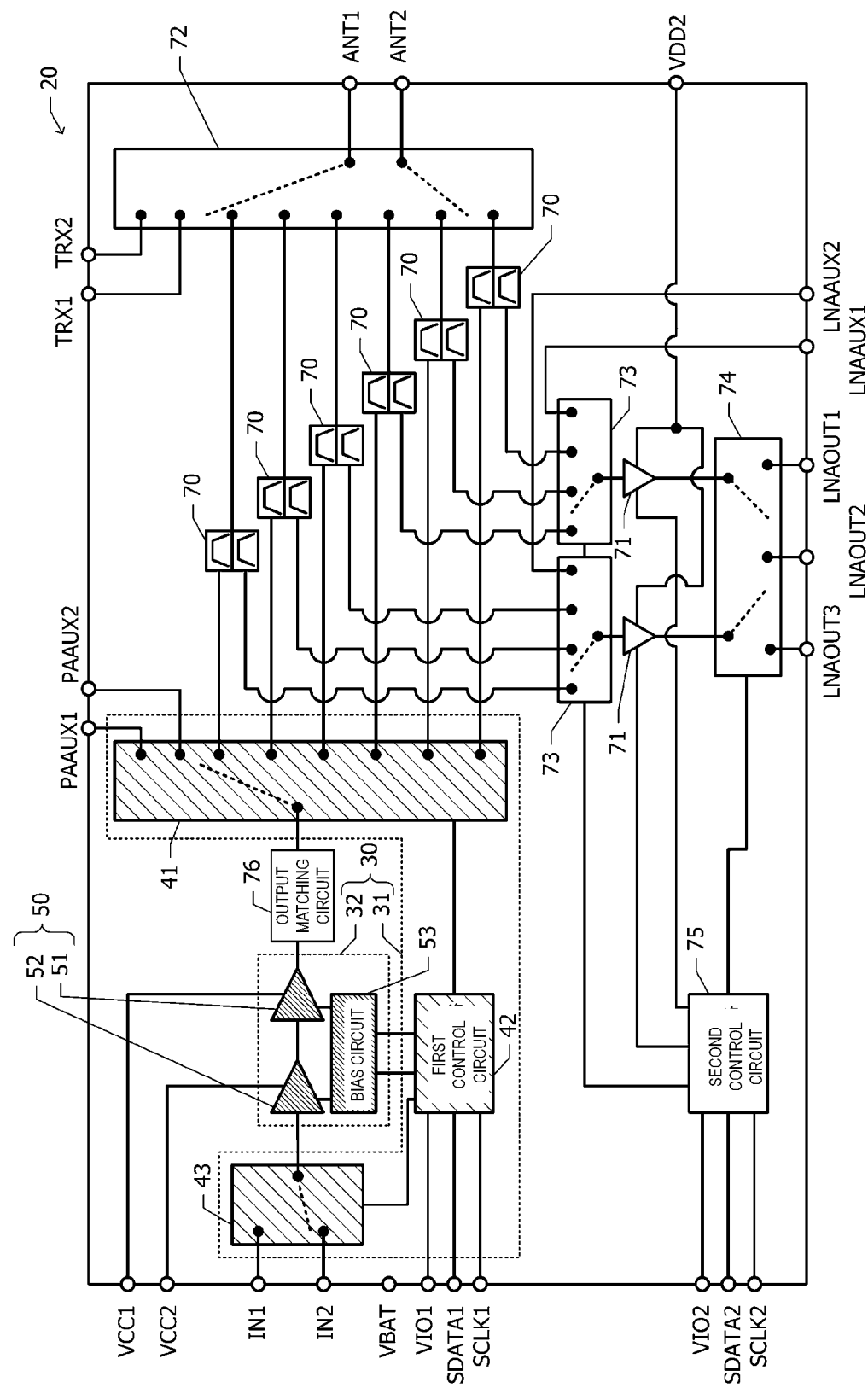
FIG. 1 is a block diagram of a radio-frequency module including a semiconductor device according to a first embodiment.

FIG. 1 is a block diagram of a radio-frequency module 20 including the semiconductor device 30 according to the first embodiment. The radio-frequency module 20 includes the semiconductor device 30 according to the first embodiment, an output matching circuit 76, a plurality of duplexers 70, an antenna switch 72, two band selection switches 73 for reception, two low-noise amplifiers 71, an output terminal selection switch 74 for reception, and a second control circuit 75. Those circuit components are flip-chip mounted on a module substrate. The radio-frequency module 20 has a function of transmitting and receiving signals in accordance with a frequency division duplex (FDD) system.

The semiconductor device 30 includes a first member 31 and a second member 32 joined to the first member 31. For example, the first member 31 is made of an elemental semiconductor, and the second member 32 is made of a compound semiconductor. An input switch 43, a first control circuit 42, and a band selection switch 41 are formed in the first member 31. A two-stage radio-frequency amplifier circuit 50 made up of a first amplifier circuit 51 and a second amplifier circuit 52, and a bias circuit 53 are formed in the second member 32. The second amplifier circuit 52 is an amplifier circuit in a first stage, and the first amplifier circuit 51 is an amplifier circuit in a final stage. In FIG. 1, circuit blocks disposed in the first member 31 are denoted by relatively light hatching, and circuit blocks disposed in the second member 32 are denoted by relatively dark hatching. The bias circuit 53 supplies bias currents to the first amplifier circuit 51 and the second amplifier circuit 52 in accordance with control signals from the first control circuit 42.

Two input contacts of the input switch 43 are connected in one-to-one relation to radio-frequency signal input terminals IN1 and IN2 disposed on or in the module substrate. Radio-frequency signals are input through the two radio-frequency signal input terminals IN1 and IN2. The input switch 43 selects one of the two input contacts and causes the radio-frequency signal input to the selected contact to be input to the radio-frequency amplifier circuit 50.

The radio-frequency signal amplified by the radio-frequency amplifier circuit 50 is input to one input contact of the band selection switch 41 after passing through the output matching circuit 76. The band selection switch 41 selects one from a plurality of output contacts and causes the radio-frequency signal amplified by the radio-frequency amplifier circuit 50 to be output from the selected output contact.

Two of the output contacts of the band selection switch 41 are connected in one-to-one relation to auxiliary output terminals PAAUX1 and PAAUX2 disposed on or in the module substrate. The other six output contacts are connected to input ports for transmission of the duplexers 70 that are prepared individually for each of bands. The band selection switch 41 has a function of selecting one from the duplexers 70 prepared individually for each of bands.

The antenna switch 72 includes a plurality of circuit-side contacts and two antenna-side contacts. Two of the circuit-side contacts of the antenna switch 72 are connected to transmitted-signal input terminals TRX1 and TRX2 in one-to-one relation. The other six circuit-side contacts are connected to input-output common ports of the duplexers 70 in one-to-one relation. The two antenna-side contacts are connected to antenna terminals ANT1 and ANT2 in one-to-one relation. An antenna is connected to each of the antenna terminals ANT1 and ANT2.

The antenna switch 72 connects the two antenna-side contacts to two selected from the circuit-side contacts in one-to-one relation. When a single band is used for communication, the antenna switch 72 connects one circuit-side contact to one antenna-side contact. A radio-frequency signal amplified by the radio-frequency amplifier circuit 50 and passed through one duplexer 70 for the corresponding band is transmitted from the antenna connected to the selected antenna-side contact.

The two band selection switches 73 for reception each include four input contacts and one output contact. Three of the four input contacts in each of the two band selection switches 73 are connected to output ports for reception of the duplexers 70 in one-to-one relation. The remaining one input contact in each of the two band selection switches 73 is connected to an auxiliary input terminal LNAAUX1 or LNAAUX2.

The output contacts of the two band selection switches 73 for reception are connected to the two low-noise amplifiers 71 in one-to-one relation. The two band selection switches 73 for reception each cause a received signal after passing through the duplexer 70 to be input to the corresponding low-noise amplifier 71.

Two circuit-side contacts of the output terminal selection switch 74 are connected to output ports of the two low-noise amplifiers 71 in one-to-one relation. Three terminal-side contacts of the output terminal selection switch 74 are connected to received-signal output terminals LNAOUT1, LNAOUT2, and LNAOUT3 in one-to-one relation. A received signal amplified by the low-noise amplifier 71 is output from the received-signal output terminal selected by the output terminal selection switch 74.

Supply voltages are applied to the first amplifier circuit 51 and the second amplifier circuit 52 from power supply terminals VCC1 and VCC2, respectively, disposed on or in the module substrate.

The first control circuit 42 is connected to a power supply terminal VIO1 a control signal terminal SDATA1, and a clock terminal SCLK1. The first control circuit 42 controls the bias circuit 53, the input switch 43, and the band selection switch 41 in accordance with control signals applied to the control signal terminal SDATA1.

The second control circuit 75 is connected to a power supply terminal VIO2, a control signal terminal SDATA2, and a clock terminal SCLK2. The second control circuit 75 controls the low-noise amplifiers 71, the band selection switch 73 for reception, and the output terminal selection switch 74 in accordance with control signals applied to the control signal terminal SDATA2.

A power supply terminal VBAT and a drain voltage terminal VDD2 are further disposed on or in the module substrate. Supply power is applied from the power supply terminal VBAT to the bias circuit for the radio-frequency amplifier circuit 50 and to the first control circuit 42. A supply voltage is applied from the drain voltage terminal VDD2 to each of the low-noise amplifiers 71.

Figure 2:
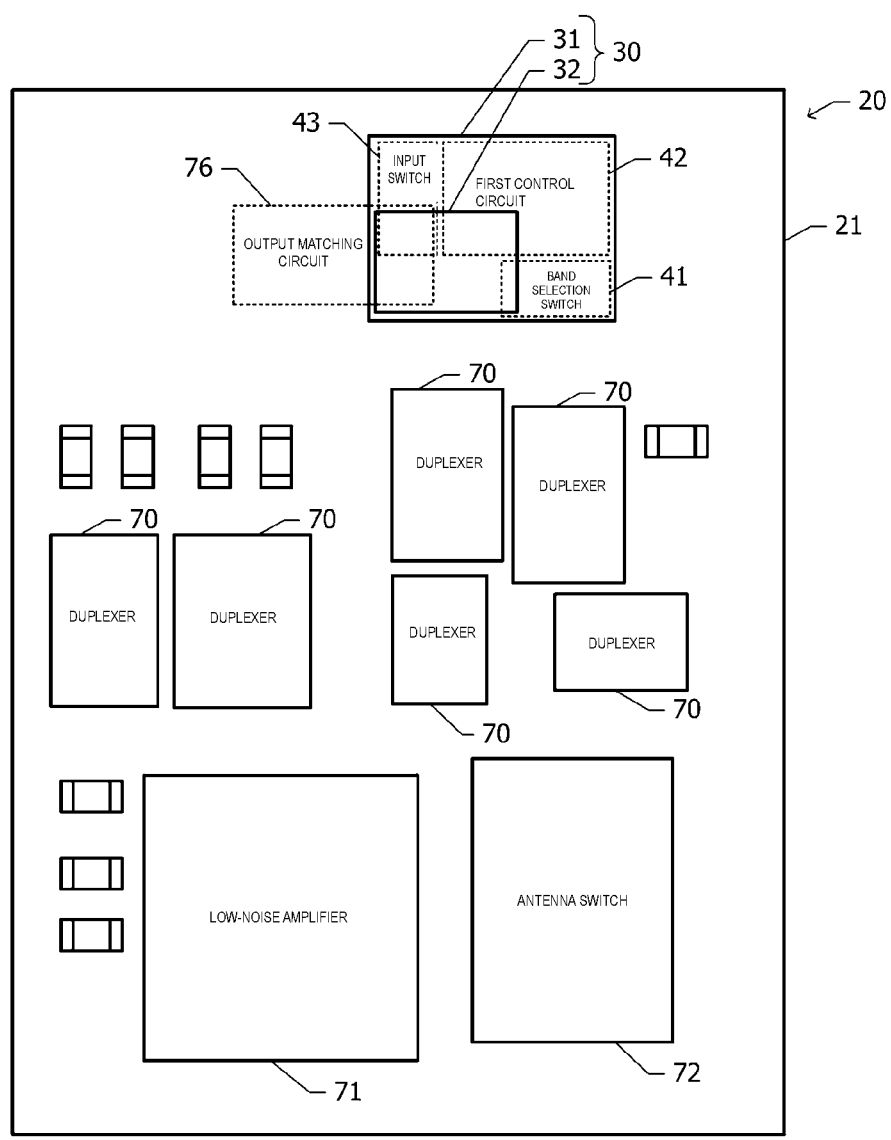
FIG. 2 illustrates a positional relation in a plan view among circuit components of the radio-frequency module according to the first embodiment.

FIG. 2 illustrates a positional relation in a plan view among circuit components of the radio-frequency module 20 according to the first embodiment. The semiconductor device 30, the duplexers 70, the low-noise amplifiers 71, the antenna switch 72, and a plurality of other surface-mounted passive components are mounted on or in the module substrate 21. The first member 31 of the semiconductor device 30 has a larger size than the second member 32 and encompasses the second member 32 in a plan view.

The band selection switch 41, the first control circuit 42, and the input switch 43 are formed in the first member 31. In FIG. 2, regions where circuit blocks constituting, for example, the band selection switch 41, the first control circuit 42, and the input switch 43 are disposed are denoted by surrounding dashed lines. Here, the term "circuit block" represents an assembly of a plurality of circuit elements, such as semiconductor elements and passive elements, constituted to realize a certain function, and of wirings connecting the circuit elements to each other. Generally, circuit design is performed for each of the circuit blocks, and the circuit blocks are laid out on a semiconductor substrate per block.

The output matching circuit 76 is constituted by passive elements, such as inductors, disposed in the module substrate, capacitors surface-mounted on the module substrate, and so on. The inductors forming the output matching circuit 76 are disposed at positions overlapping the semiconductor device 30 in a plan view. In this Specification, the state in which "two members overlap in a plan view" includes a state in which one member encompasses the other member, a state in which part of one member overlaps part of the other member, and a state in which outer peripheral lines of two members match with each other.

Figure 3:
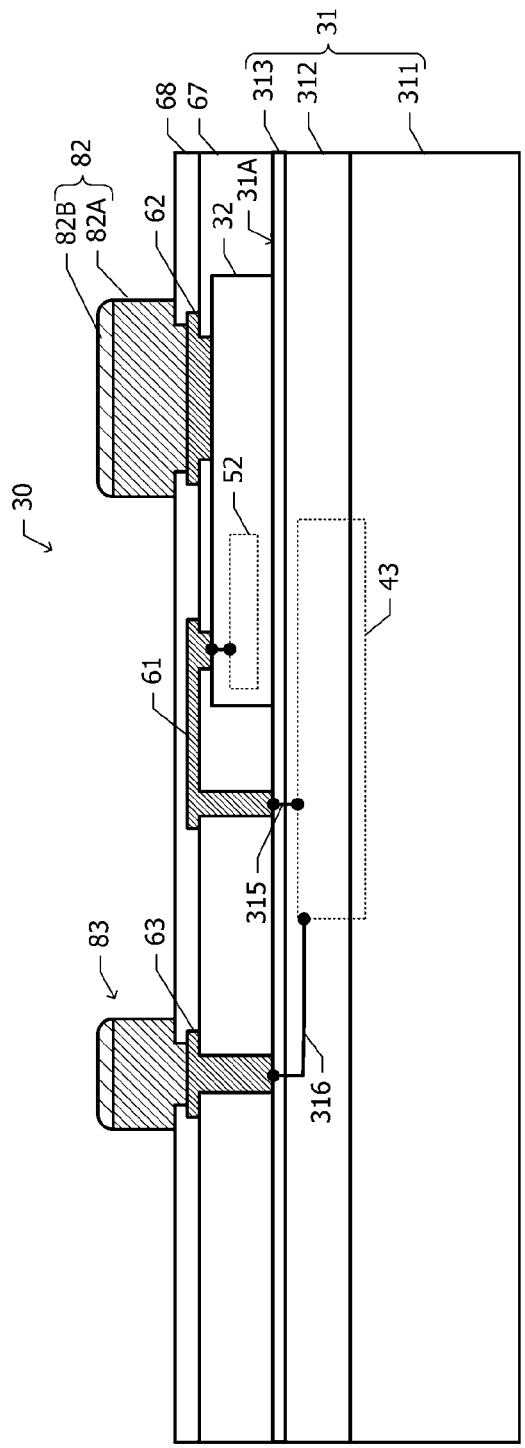
FIG. 3 is a schematic sectional view of the semiconductor device according to the first embodiment.

FIG. 3 is a schematic sectional view of the semiconductor device 30 according to the first embodiment. The first member 31 includes a substrate 311, a multilayer wiring structure 312 disposed on the substrate 311, and a first-member protection film 313 covering a surface of the multilayer wiring structure 312. The substrate 311 includes a semiconductor portion made of an elemental semiconductor. For example, a silicon substrate or a silicon-on-insulator (SOI) substrate is used as the substrate 311. The band selection switch 41 (FIG. 1), the first control circuit 42 (FIG. 1), and the input switch 43 (FIG. 1) are constituted by semiconductor elements formed in a surface layer portion of the substrate 311 and by wirings in the multilayer wiring structure 312. In FIG. 3, a region where the input switch 43 is formed is denoted by a surrounding dashed line. An outermost surface of the first member 31 is called here a first surface 31A. An upper surface of the first-member protection film 313 corresponds to the first surface 31A.

The second member 32 is joined to the first surface 31A of the first member 31 in surface-contact with the first surface 31A. The first amplifier circuit 51 (FIG. 1), the second amplifier circuit 52 (FIG. 1), and the bias circuit 53 (FIG. 1) are formed in the second member 32. In FIG. 3, a region where the second amplifier circuit 52 is disposed is denoted by a surrounding dashed line.

An interlayer insulating film 67 is disposed on the first surface 31A to cover the second member 32. A plurality of openings are formed in the interlayer insulating film 67 at predetermined positions. A plurality of pads 62 and 63 and a plurality of wirings 61 are disposed on the interlayer insulating film 67. A wiring layer in which the pads 62 and 63 and the wirings 61 are disposed is called a redistribution layer in some cases. The wirings 61 in the redistribution layer are called rewiring lines (redistribution lines) in some cases.

One of the wirings 61 is connected to the input switch 43 via a wiring 315 in the multilayer wiring structure 312 after passing through one of the openings formed in the interlayer insulating film 67 and is further connected to the second amplifier circuit 52 after passing through another opening formed in the interlayer insulating film 67. In other words, the input switch 43 formed in the first member 31 and the second amplifier circuit 52 formed in the second member 32 are electrically directly connected via the wiring 61 in the redistribution layer. Here, the expression "electrically directly connected" indicates that two components are electrically connected without any active element, such as a transistor, interposed therebetween. For example, when two components are connected to each other with a circuit formed only by passive elements, such as an impedance matching circuit, interposed therebetween, the connection is included in the case in which the two components are "electrically directly connected". The other wirings in the redistribution layer are used, for example, for connection between the first control circuit 42 (FIG. 1) and the bias circuit 53 (FIG. 1).

The pad 62 is encompassed within the second member 32 in a plan view and is connected to the circuit formed in the second member 32. In addition to the pad 62, there are other pads encompassed disposed within the second member 32 in a plan view. The pad 63 is disposed outside the second member 32 in a plan view and, after passing through the opening formed in the interlayer insulating film 67, is connected to the input switch 43 formed in the first member 31 via a wiring 316 in the multilayer wiring structure 312. In addition to the pad 63, there are other pads disposed outside the second member 32 in a plan view.

A protection film 68 is disposed on the interlayer insulating film 67 to cover the redistribution layer. Openings are formed in the protection film 68 to make partial regions of upper surfaces of the pads 62 and 63 exposed. Conductive protrusions 82 and 83 are disposed respectively on the pads 62 and 63. The conductive protrusion 82 includes a Cu pillar 82A connected to the pad 62 and a solder layer 82B disposed on an upper surface of the Cu pillar 82A. The conductive protrusion 82 with such a structure is called a Cu pillar bump.

An under bump metal layer may be disposed on a bottom surface of the Cu pillar 82A with intent to improve adhesion of the Cu pillar. The other conductive protrusion 83 also has the same multilayer structure as the conductive protrusion 82. Instead of the Cu pillar bump, for example, an Au bump, a solder ball bump, or a conductive column erected on the pad may also be used as the conductive protrusions 82 and 83 and so on. A bump without including a solder layer, like an Au bump, is also called a pillar. The conductive column erected on the pad is also called a post.

The conductive protrusion 82 is used for connection, for example, between the power supply terminal VCC1 and the first amplifier circuit 51 illustrated in FIG. 1, between the power supply terminal VCC2 and the second amplifier circuit 52, or between the first amplifier circuit 51 and the output matching circuit 76. The conductive protrusion 82 is further used for connection between a ground conductor in the second member 32 and a ground conductor in or on the module substrate.

The conductive protrusion 83 is used for connection, for example, between the input switch 43 and each of the radio-frequency signal input terminals IN1 and IN2 illustrated in FIG. 1, between the first control circuit 42 and each of the power supply terminal VIO1, the control signal terminal SDATA1, and the clock terminal SCLK1, or between the band selection switch 41 and each of the output matching circuit 76, the duplexers 70, and so on.

Figure 4A:
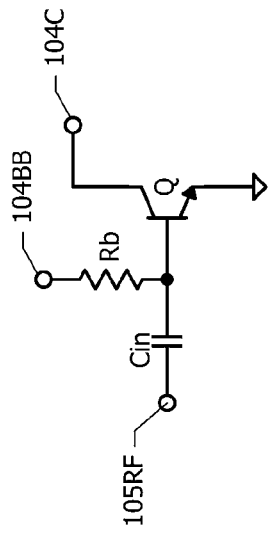
FIG. 4A is an equivalent circuit diagram for each of a plurality of cells forming a first amplifier circuit in the semiconductor device according to the first embodiment.

FIG. 4A is an equivalent circuit diagram for each of a plurality of cells forming the first amplifier circuit 51 (FIG. 1) in the semiconductor device according to the first embodiment. The first amplifier circuit 51 is constituted by the cells connected in parallel to each other. The second amplifier circuit 52 (FIG. 1) also has a similar circuit configuration to that of the first amplifier circuit 51. However, the number of cells forming the second amplifier circuit 52 is smaller than the number of cells forming the first amplifier circuit 51.

The cells each include a transistor Q, an input capacitor Cin, and a ballast resistance element Rb. A base of the transistor Q is connected to a radio-frequency signal input wiring 105RF through the input capacitor Cin. The base of the transistor Q is further connected to a base bias wiring 104BB through the ballast resistance element Rb. An emitter of the transistor Q is grounded. A collector of the transistor Q is connected to a collector wiring 104C. A supply voltage is applied to the collector of the transistor Q via the collector wiring 104C, and an amplified radio-frequency signal is output from the collector.

Figure 4B:
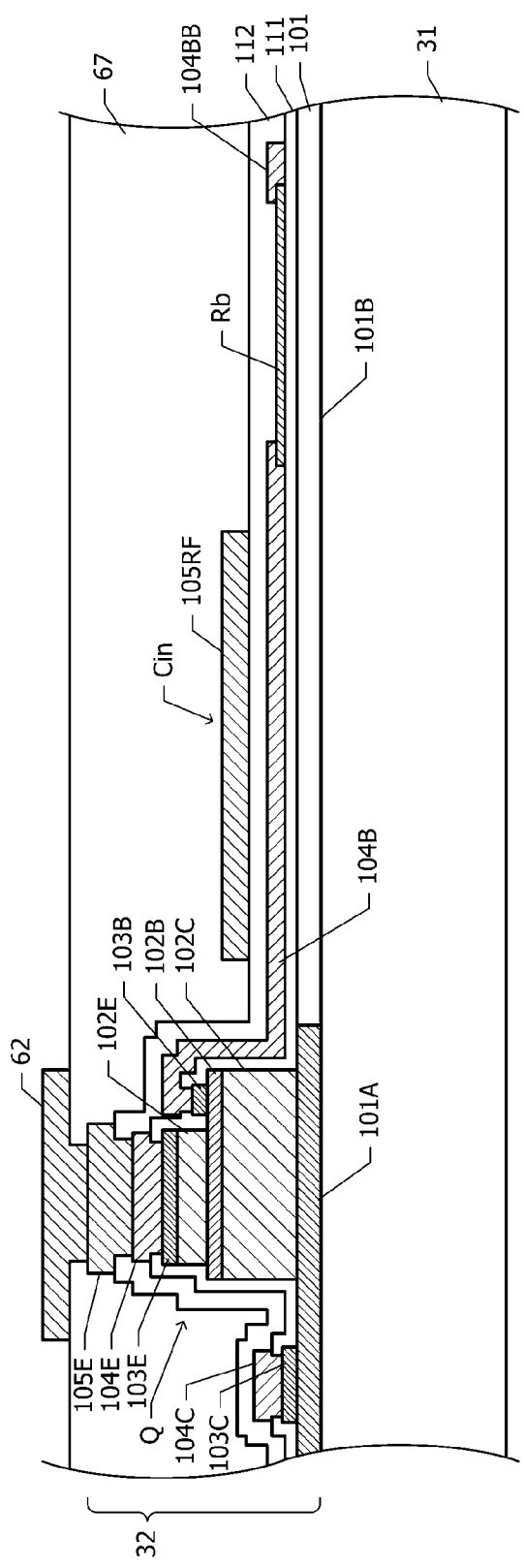
FIG. 4B is a schematic sectional view of one cell of the first amplifier circuit formed in a second member.

FIG. 4B is a schematic sectional view of one cell of the first amplifier circuit 51 (FIG. 1) formed in the second member 32. The second member 32 includes an underlying semiconductor layer 101. The underlying semiconductor layer 101 is in surface contact with the first member 31, whereby the second member 32 is joined to the first member 31. The underlying semiconductor layer 101 is divided into a conductive region 101A and an element isolation region 101B. For example, GaAs is used for the underlying semiconductor layer 101. The conductive region 101A is made of n-type GaAs, and the element isolation region 101B is formed by ion injection of an insulating impurity into an n-type GaAs layer.

The transistor Q is disposed on the conductive region 101A. The transistor Q includes a collector layer 102C, a base layer 102B, and an emitter layer 102E that are laminated in order starting from a side close to the conductive region 101A. The emitter layer 102E is disposed on a partial region of the base layer 102B. In one example, the collector layer 102C is made of n-type GaAs, the base layer 102B is made of p-type GaAs, and the emitter layer 102E is made of n-type InGaP. Thus, the transistor Q is a heterojunction bipolar transistor.

A base electrode 103B is disposed on the base layer 102B and is electrically connected to the base layer 102B. An emitter electrode 103E is disposed on the emitter layer 102E and is electrically connected to the emitter layer 102E. A collector electrode 103C is disposed on the conductive region 101A. The collector electrode 103C is electrically connected to the collector layer 102C via the conductive region 101A.

An interlayer insulating film 111 as a first insulating layer is disposed on the underlying semiconductor layer 101 to cover the transistor Q, the collector electrode 103C, the base electrode 103B, and the emitter electrode 103E. The interlayer insulating film 111 as the first insulating layer is made of an inorganic insulating material such as SiN, for example. A plurality of openings are formed in the interlayer insulating film 111 at predetermined positions.

An emitter wiring 104E, a base wiring 104B, the collector wiring 104C, and the base bias wiring 104BB each forming a first wiring layer are disposed on the interlayer insulating film 111. The ballast resistance element Rb is further disposed on the interlayer insulating film 111. The emitter wiring 104E passes through one opening formed in the interlayer insulating film 111 and is connected to the emitter electrode 103E. The base wiring 104B passes through another opening formed in the interlayer insulating film 111 and is connected to the base electrode 103B. The collector wiring 104C passes through still another opening formed in the interlayer insulating film 111 and is connected to the collector electrode 103C.

The base wiring 104B extends up to a region where the transistor Q is not disposed, and an extended end of the base wiring 104B overlaps one end portion of the ballast resistance element Rb. In the overlapping region therebetween, the base wiring 104B and the ballast resistance element Rb are electrically connected to each other. The other end portion of the ballast resistance element Rb overlaps the base bias wiring 104BB. In the overlapping region therebetween, the ballast resistance element Rb and the base bias wiring 104BB are electrically connected to each other.

An interlayer insulating film 112 as a second insulating layer is disposed on the interlayer insulating film 111 to cover the emitter wiring 104E, the base wiring 104B, the base bias wiring 104BB, and the ballast resistance element Rb each forming the first wiring layer. The interlayer insulating film 112 as the second insulating layer is also made of an inorganic insulating material such as SiN, for example.

An emitter wiring 105E and a radio-frequency signal input wiring 105RF each forming a second wiring layer are disposed on the interlayer insulating film 112. The emitter wiring 105E in the second wiring layer passes through an opening formed in the interlayer insulating film 112 and is connected to the emitter wiring 104E in the first wiring layer. Part of the radio-frequency signal input wiring 105RF overlaps the base wiring 104B in the first wiring layer in a plan view. In the overlapping region therebetween, the input capacitor Cin is formed.

The interlayer insulating film 67 as a third insulating layer is disposed to cover the emitter wiring 105E and the radio-frequency signal input wiring 105RF in the second wiring layer. The interlayer insulating film 67 as the third insulating layer is made of an organic insulating material such as polyimide, for example. As illustrated in FIG. 3, the interlayer insulating film 67 as the third insulating layer extends to cover the first member 31 as well.

The pad 62 is disposed on the interlayer insulating film 67 as the third insulating layer. The pad 62 passes through an opening formed in the interlayer insulating film 67 and is connected to the emitter wiring 105E in the second wiring layer.

Figure 5A:
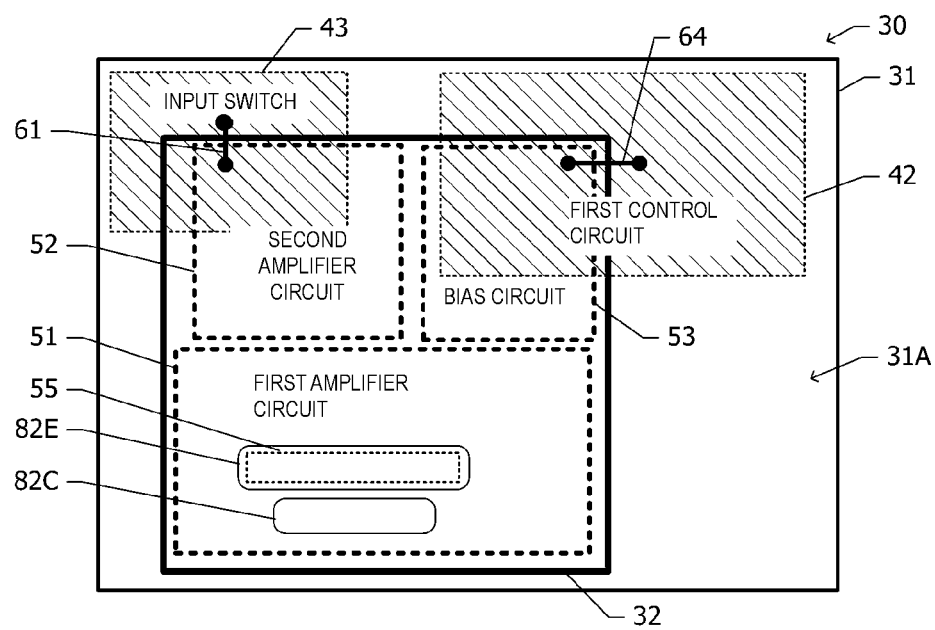
FIG. 5A is a schematic view illustrating an in-plane layout of circuit blocks when a first surface of the semiconductor device according to the first embodiment is viewed in plan.

FIG. 5A is a schematic view illustrating an in-plane layout of the circuit blocks when the first surface 31A (FIG. 3) of the semiconductor device 30 according to the first embodiment is viewed in plan. The circuit blocks formed in the first member 31 constitute the band selection switch 41, the first control circuit 42, and the input switch 43 illustrated in FIG. 1. When the first surface 31A is viewed in plan, those circuit blocks are disposed in an inner region of the first surface 31A. FIG. 5A illustrates the circuit block constituting the input switch 43 and the circuit block constituting the first control circuit 42. In FIG. 5A, the circuit blocks formed in the first member 31 are denoted by hatching with rightward declining lines.

The circuit blocks formed in the second member 32 constitute the first amplifier circuit 51 in the final stage, the second amplifier circuit 52 in the first stage, and the bias circuit 53.

Figure 5B:
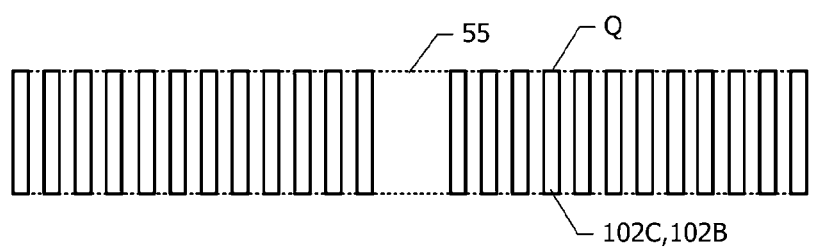
FIG. 5B illustrates a layout of a plurality of transistors forming the first amplifier circuit in a plan view.

FIG. 5B illustrates a layout of the plurality of transistors Q (FIGS. 4A and 4B) forming the first amplifier circuit 51 in a plan view. The transistors Q each include the collector layer 102C and the base layer 102B. An outer peripheral line of the collector layer 102C and an outer peripheral line of the base layer 102B substantially match with each other in a plan view. The emitter layer 102E (FIG. 4B) is encompassed within the base layer 102B in a plan view. The transistors Q each have an elongate shape in one direction (up-down direction in FIG. 5B) in a plan view. Lengthwise directions of the transistors Q are parallel, and the transistors Q are disposed side by side in a direction (right-left direction in FIG. 5B) perpendicular to the lengthwise direction.

The transistors Q are distributed in a region 55. The region 55 where the transistors Q are distributed is defined, for example, as a minimum convex polygon encompassing the transistors Q in a plan view.

Transistor trains each made up of the plurality of transistors Q may be disposed in multiple rows in a direction perpendicular to the direction in which the transistors Q are arrayed. In such a case, a minimum convex polygon encompassing all the transistors Q belonging to the transistor trains may be defined as the region 55 where the transistors Q are distributed.

As illustrated in FIG. 5A, the region 55 where the transistors Q are distributed is positioned within the circuit block constituting the first amplifier circuit 51. Conductive protrusions 82E and 82C are connected respectively to emitters and collectors of the transistors Q. In a plan view, the conductive protrusion 82E for the emitters encompasses the region 55 where the transistors Q are distributed. The input capacitor Cin and the ballast resistance element Rb illustrated in FIGS. 4A and 4B are further disposed in the circuit block constituting the first amplifier circuit 51.

The circuit block constituting the second amplifier circuit 52 overlaps the circuit block constituting the input switch 43 in a plan view, and the circuit block constituting the bias circuit 53 overlaps some of the circuit blocks constituting the first control circuit 42 in a plan view. The first control circuit 42 includes, for example, a circuit block outputting a current to control a bias supplied to the first amplifier circuit 51, and a circuit block constituting a fuse array. In this embodiment, the circuit block outputting the current to control the bias supplied to the first amplifier circuit 51 overlaps the circuit block constituting the bias circuit 53 in a plan view. In this Specification, the state in which "two circuit blocks overlap in a plan view" includes a state in which a region occupied by one circuit block encompasses a region occupied by the other circuit block, a state in which part of a region occupied by one circuit block overlaps part of a region occupied by the other circuit block, and a state in which outer peripheral lines of regions occupied by the two circuit blocks match with each other. A state in which one circuit block includes, as constituent elements, a plurality of semiconductor elements, a plurality of passive elements, and wirings connecting those elements and in which only the wirings among the constituent elements overlap the other circuit block can also be regarded as the state in which two circuit blocks overlap.

The input switch 43 and the second amplifier circuit 52 are electrically directly connected via the wiring 61 (FIG. 3) in the redistribution layer. The first control circuit 42 and the bias circuit 53 are electrically directly connected via the other wiring 64 in the redistribution layer. The wirings 61 and 64 intersect edges of the second member 32 in a plan view.

A method of fabricating the semiconductor device 30 according to the first embodiment will be described below with reference to FIGS. 6A to 7D. FIGS. 6A to 7C are sectional views of the semiconductor device 30 during a manufacturing process, and FIG. 7D is a sectional view of the finished semiconductor device 30.

Figure 6A:
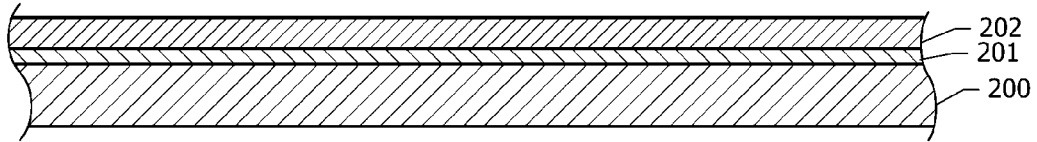
FIGS. 6A to 6F are sectional views of the semiconductor device during a manufacturing process.

As illustrated in FIG. 6A, a release layer 201 is epitaxially grown on a single-crystal base substrate 200 made of a compound semiconductor such as GaAs, and an element formation layer 202 is formed on the release layer 201. The transistors Q, the first wiring layer, the second wiring layer, and so on in the second member 32, illustrated in FIG. 4B, are formed in the element formation layer 202. Those circuit elements and wiring layers are formed in accordance with a general semiconductor process. FIG. 6A does not illustrate element structures formed in the element formation layer 202. In this stage, the element formation layer 202 is not yet separated for each second member 32.

Figure 6B:
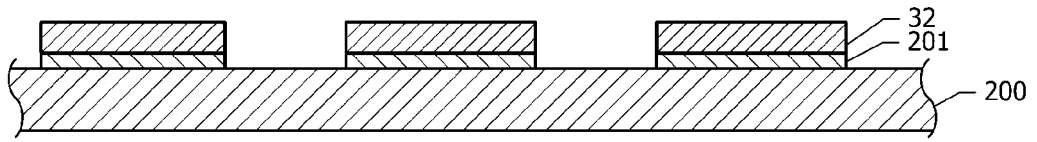

Next, as illustrated in FIG. 6B, the element formation layer 202 (FIG. 5A) and the release layer 201 are subjected to patterning by using a resist pattern (not illustrated) as an etch mask. In this stage, the element formation layer 202 is separated for each second member 32 (FIG. 5A).

Figure 6C:
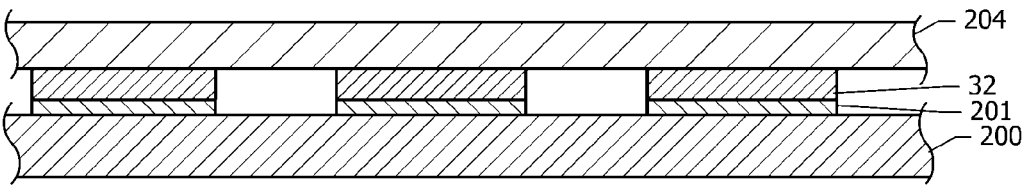

Next, as illustrated in FIG. 6C, a connecting support 204 is bonded on the separated second members 32. As a result, the individual second members 32 are connected to each other by the connecting support 204. The resist pattern used as the etch mask in the patterning step of FIG. 6B may be left such that the resist pattern exists between the second member 32 and the connecting support 204.

Figure 6D:
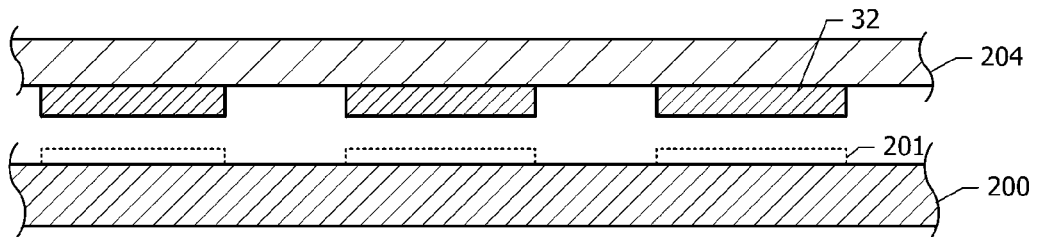

Next, as illustrated in FIG. 6D, the release layer 201 is selectively etched away with respect to the base substrate 200 and the second member 32. As a result, the second member 32 and the connecting support 204 are released from the base substrate 200. To selectively etch the release layer 201, the release layer 201 is formed of a compound semiconductor having an etch resistance different from the etch resistances of both the base substrate 200 and the second member 32.

Figure 6E:
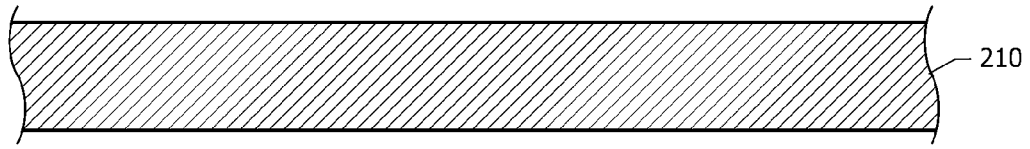

As illustrated in FIG. 6E, a substrate 210 is prepared which includes the input switch 43, the multilayer wiring structure 312 (FIG. 3), and so on that are to be disposed in the first member 31 (FIG. 3). In this stage, the substrate 210 is not yet separated for each first member 31.

Figure 6F:
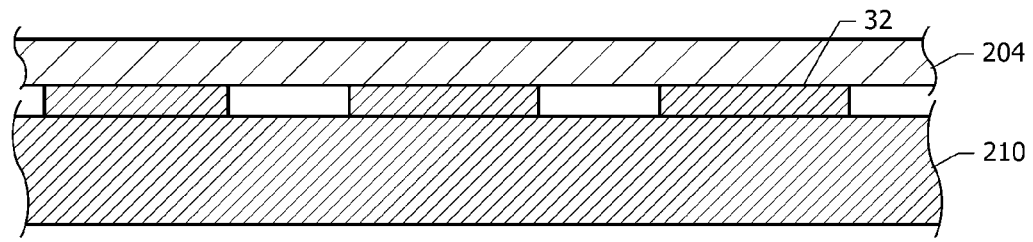

As illustrated in FIG. 6F, the second member 32 is joined to the substrate 210. Van der Waals bonding or hydrogen bonding is utilized to join the second member 32 and the substrate 210. Alternatively, the second member 32 may be joined to the substrate 210 by, for example, electrostatic force, covalent bonding, or eutectic alloy bonding. For example, when part of a surface of the substrate 210 is made of Au, the second member 32 and the substrate 210 may be joined to each other by bringing the second member 32 into close contact with an Au region and then applying pressure.

Figure 7A:
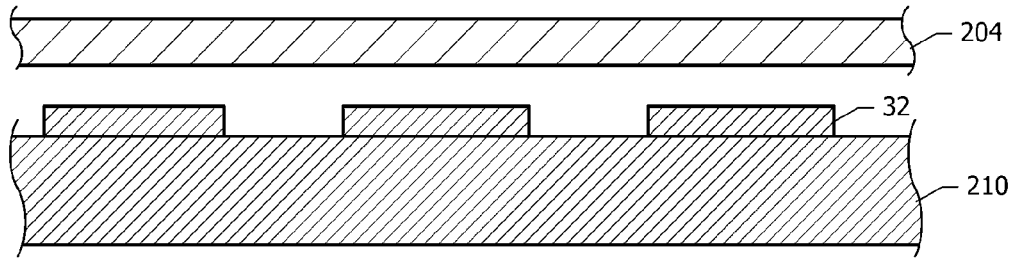
FIGS. 7A to 7C are sectional views of the semiconductor device during the manufacturing process.
Figure 7B:
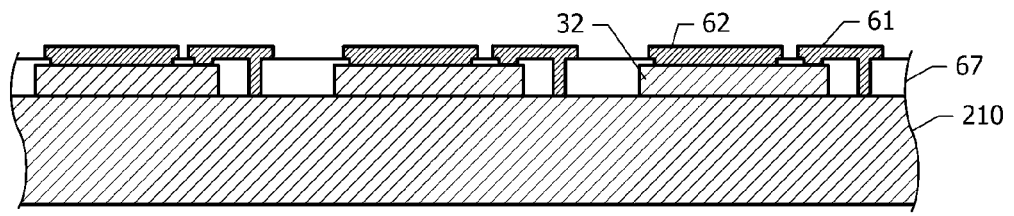

Next, as illustrated in FIG. 7A, the connecting support 204 is released from the second member 32. After releasing the connecting support 204, as illustrated in FIG. 7B, the interlayer insulating film 67 and the redistribution layer are formed over the substrate 210 and the second member 32. The redistribution layer includes, for example, the wirings 61 and the pads 62 and 63 (FIG. 3).

Figure 7C:
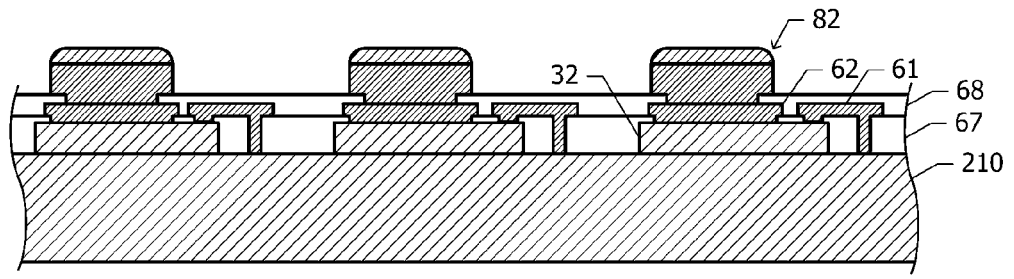
Figure 7D:
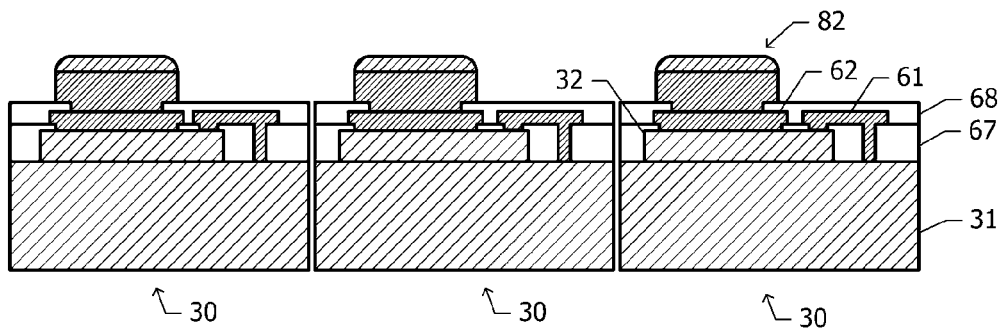
FIG. 7D is a sectional view of the finished semiconductor device.

Next, as illustrated in FIG. 7C, the protection film 68 is formed on the redistribution layer, and openings are formed in the protection film 68 at predetermined positions. There-after, the conductive protrusion 82 is formed in each of the openings and on the protection film 68. At the same time as forming the conductive protrusion 82, the other conductive protrusion 83 (FIG. 3) and so on are also formed.

Finally, as illustrated in FIG. 7D, the substrate 210 is cut with a dicing machine. As a result, the individual semiconductor devices 30 are obtained.

Advantageous effects of the first embodiment will be described below.

In the semiconductor device 30 according to the first embodiment, the transistor Q (FIG. 5B) in the first amplifier circuit 51 is a maximum heat source. Therefore, temperature in the region 55 where the plurality of transistors Q are disposed rises. In the first embodiment, as illustrated in FIG. 3, the second member 32 is joined to the first member 31 in surface contact therewith, and a heat transfer path extending from the second member 32 to the first member 31 while intersecting an interface between the first member 31 and the second member 32 is formed. Heat generated from the transistors Q is transferred to the first member 31 through the above-mentioned heat transfer path. An opening may be formed in the first-member protection film 313 (FIG. 3) in a region overlapping the second member 32 in a plan view, and metal may be filled into the opening. In such a case, since the second member 32 contacts a metal portion, thermal resistance of the heat transfer path can be reduced.

The heat transferred from the second member 32 to the first member 31 diffuses in the first member 31. The heat having diffused in the first member 31 is radiated to the outside from surfaces of the first member 31. When the semiconductor device 30 is covered with molding resin in a state of being mounted on the module substrate, the heat is transferred from the first member 31 to the molding resin.

Furthermore, the conductive protrusion 82 (FIG. 3) functions as a heat transfer path from the second member 32 to the module substrate. Thus, two heat transfer paths, namely the heat transfer path extending from the second member 32 to the module substrate and the heat transfer path extending from the second member 32 to the first member 31, are formed. Therefore, the characteristics of heat dissipation from the second member 32 can be improved. To obtain a sufficient effect of improving the characteristics of heat dissipation, a semiconductor portion of the substrate 311 of the first member 31 is preferably made of a semiconductor, for example, an elemental semiconductor such as Si or Ge, with higher thermal conductivity than the compound semiconductor forming the semiconductor elements that are formed in the second member 32. Moreover, from the viewpoint of amplifying the radio-frequency signal, semiconductor elements made of a compound semiconductor with higher electron mobility than the semiconductor portion of the substrate 311 of the first member 31 are preferably used as the semiconductor elements formed in the second member 32.

In the first embodiment, as illustrated in FIGS. 3 and 5A, the circuit blocks constituting the input switch 43 and the second amplifier circuit 52 electrically directly connected to each other via the wiring 61 in the redistribution layer overlap in a plan view. Similarly, as illustrated in FIG. 5A, the circuit blocks constituting the first control circuit 42 and the bias circuit 53 electrically directly connected to each other via the wiring 64 in the redistribution layer overlap in a plan view.

Generally, when the circuit block in the first member 31 and the circuit block in the second member 32 are stacked one above the other, electronic circuits constituted by the stacked circuit blocks are more likely interfere electromagnetically. Between two electronic circuits electrically directly connected to each other, however, even when electromagnetic interference occurs, influences of the interference upon operations of the electronic circuits are small. For example, even when the circuit block constituting the input switch 43 and the circuit block constituting the second amplifier circuit 52 are stacked one above the other, influences caused by electromagnetic interference are small. Similarly, even when the circuit block constituting the first control circuit 42 and the circuit block constituting the bias circuit 53 are stacked one above the other, influences caused by electromagnetic interference are small. In the first embodiment, since the circuit blocks constituting two circuits electrically directly connected to each other are disposed to overlap in a plan view, the influences caused by the electromagnetic interference are reduced in the entirety of the circuits.

Furthermore, since the circuit block in the first member 31 and the circuit block in the second member 32 are disposed to overlap in a plan view, a size of the semiconductor device 30 in a plan view can be reduced. Thus, the first embodiment can reduce the size of the semiconductor device 30 while reducing the influences caused by the electromagnetic interference between the two circuit blocks.

A modification of the first embodiment will be described below.

An impedance matching circuit may be inserted between the input switch 43 and the second amplifier circuit 52 although the first embodiment does not refer to the impedance matching circuit therebetween. The impedance matching circuit may be formed in the first member 31 or in the second member 32. Usually, the impedance matching circuit is constituted by passive elements, such as a capacitor and an inductor, and does not include an active element such as a transistor. Accordingly, even when the input switch 43 and the second amplifier circuit 52 are connected via the impedance matching circuit, it can be said that they are electrically directly connected to each other.

The impedance matching circuit inserted between the input switch 43 and the second amplifier circuit 52 is sometimes disposed in one circuit block together with the second amplifier circuit 52. In such a case, the circuit block constituting the impedance matching circuit and the second amplifier circuit 52 and the circuit block constituting the input switch 43 may be disposed to overlap in a plan view.

Another modification of the first embodiment will be described below with reference to FIG. 8.

Figure 8:
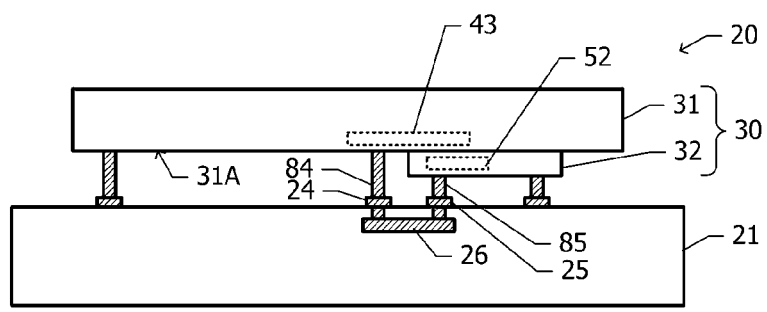
FIG. 8 is a sectional view of a semiconductor module according to a modification of the first embodiment.

FIG. 8 is a sectional view of a semiconductor module 20 according to the modification. In the first embodiment (FIG. 3), the input switch 43 and the second amplifier circuit 52 are electrically directly connected via the wiring 61 in the redistribution layer. On the other hand, in the modification illustrated in FIG. 8, the input switch 43 and the second amplifier circuit 52 are electrically directly connected via a wiring 26 in the module substrate 21.

More specifically, a first conductive protrusion 84 protrudes from the first surface 31A of the first member 31. A second conductive protrusion 85 protrudes from the second member 32 in the same direction as the first conductive protrusion 84. The semiconductor device 30 is mounted on the module substrate 21 in such a posture that the first conductive protrusion 84 and the second conductive protrusion 85 face the module substrate 21. The first conductive protrusion 84 is connected to the input switch 43, and the second conductive protrusion 85 is connected to the second amplifier circuit 52.

The first conductive protrusion 84 and the second conductive protrusion 85 are fixed respectively to lands 24 and 25 disposed on a surface of the module substrate 21 with solders. The lands 24 and 25 are connected to each other via the wiring 26 in the module substrate 21.

Like the modification illustrated in FIG. 8, the circuit block in the first member 31 and the circuit block in the second member 32, both the circuit blocks overlapping in a plan view, may be electrically directly connected via the wiring 26 in the module substrate 21.

Although, in the first embodiment, the semiconductor device 30 is mounted on the radio-frequency module 20 (FIG. 1) adapted for the frequency division duplex (FDD) system, the semiconductor device 30 may be mounted on a radio-frequency module adapted for a time division duplex (TDD) system.

When the semiconductor device 30 is mounted on the radio-frequency module adapted for the TDD system, a transmit-receive switch is used instead of the band selection switch 41 (FIG. 1). The transmit-receive switch includes two contacts and one common terminal. One of the two contacts is connected to the first amplifier circuit 51 through the output matching circuit 76 (FIG. 1). The other contact is connected to the low-noise amplifier 71 (FIG. 1) for amplifying the received signal or to the low-noise amplifier 71 through the band selection switch 73 (FIG. 1) for reception. The common terminal is connected to the antenna terminal through a filter.

Second Embodiment

A semiconductor device according to a second embodiment will be described below with reference to FIG. 9. In the following, description of a configuration common to that of the semiconductor device according to the first embodiment described above with reference to FIGS. 1 to 7D is omitted.

Figure 9:
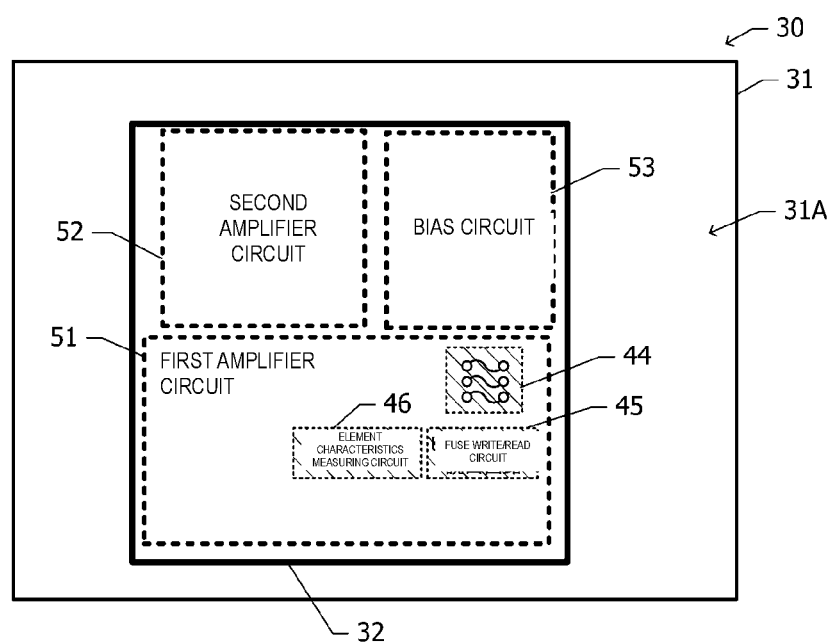
FIG. 9 is a schematic view illustrating an in-plane layout of circuit blocks when a first surface of a semiconductor device according to a second embodiment is viewed in plan.

FIG. 9 is a schematic view illustrating an in-plane layout of circuit blocks when the first surface 31A (FIG. 3) of the semiconductor device 30 according to the second embodiment is viewed in plan. In the second embodiment, a fuse array 44, a fuse write/read circuit 45, and an element characteristics measuring circuit 46 are formed in the first member 31. In FIG. 9, circuit blocks formed in the first member 31 are denoted by hatching with rightward declining lines.

The fuse array 44 is constituted by a plurality of fuses. The fuse write/read circuit 45 executes write into each fuse of the fuse array 44 (namely, disconnection of each fuse) and read of a continuity/disconnection state of each fuse. The continuity/disconnection state of the fuse array 44 is set, for example, after the end of the semiconductor process with intent to compensate for variations in manufacturing characteristics of the semiconductor device 30. The write into the fuse array 44 is executed before shipment of a product. The read of the continuity/disconnection state of the fuse array 44 is executed immediately after the start of power supply to the semiconductor device 30, and a read result is held in a latch circuit for each of circuits utilizing the read result. Accordingly, the fuse array 44 and the fuse write/read circuit 45 are not operated during a period in which the first amplifier circuit 51 and the second amplifier circuit 52 are under amplifying operation.

The element characteristics measuring circuit 46 is disposed to measure characteristics of each element in the semiconductor device 30. The element characteristics measuring circuit 46 is used, for example, to evaluate the characteristics and to check pass/fail of each element in the semiconductor device 30. Accordingly, the element characteristics measuring circuit 46 is not operated during the period in which the first amplifier circuit 51 and the second amplifier circuit 52 are under amplifying operation.

Thus, in the second embodiment, the circuit block constituting the first amplifier circuit 51 overlaps some of the circuit blocks in the first member 31 in a plan view, those some circuit blocks being not operated during the operation of the first amplifier circuit 51.

Advantageous effects of the second embodiment will be described below.

The circuit blocks in the first member 31 overlapping the circuit block constituting the first amplifier circuit 51 in a plan view are not operated during the operation of the first amplifier circuit 51. Therefore, the circuit blocks in the first member 31 overlapping the first amplifier circuit 51 in a plan view do not affect the operation of the first amplifier circuit 51. Conversely, the first amplifier circuit 51 does not affect operations of the circuit blocks in the first member 31 overlapping the circuit block constituting the first amplifier circuit 51 in a plan view. Accordingly, as in the first embodiment, the second embodiment can reduce the size of the semiconductor device 30 while reducing the influences caused by the electromagnetic interference between the circuit block in the first member 31 and the circuit block in the second member 32.

Third Embodiment

A semiconductor device according to a third embodiment will be described below with reference to FIGS. 10A and 10B. In the following, description of a configuration common to that of the semiconductor device according to the first embodiment described above with reference to FIGS. 1 to 7D is omitted.

Figure 10A:
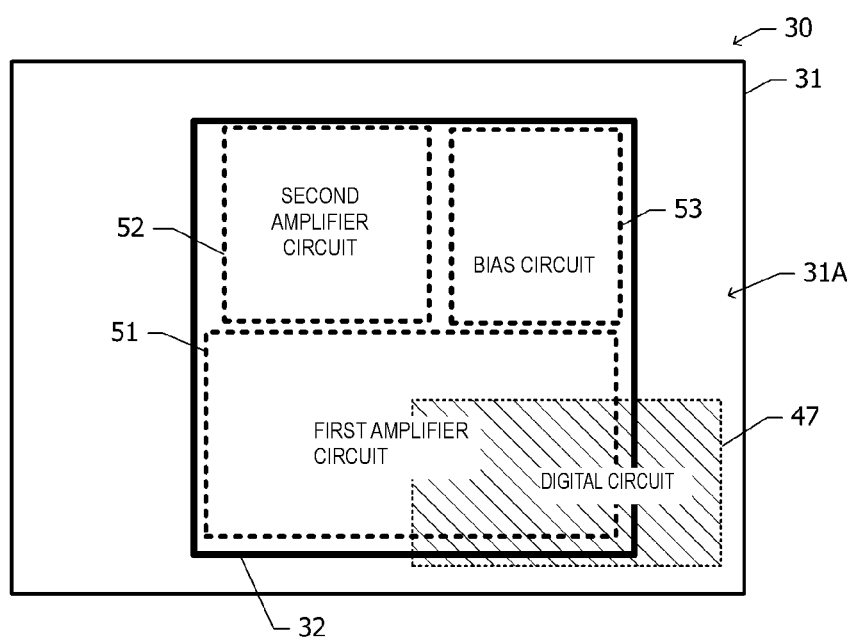
FIG. 10A is a schematic view illustrating an in-plane layout of circuit blocks when a first surface of a semiconductor device according to a third embodiment is viewed in plan.

FIG. 10A is a schematic view illustrating an in-plane layout of circuit blocks when the first surface 31A (FIG. 3) of the semiconductor device 30 according to the third embodiment is viewed in plan. In the third embodiment, a digital circuit 47 is formed in the first member 31. In FIG. 10A, a circuit block formed in the first member 31 is denoted by hatching with rightward declining lines. The digital circuit 47 decodes digital signals, such as command signals, data, and so on that are input from external circuits, converts the digital signals to analog signals, and applies the analog signals to the first control circuit 42 (FIG. 1) and so on. The first control circuit 42 controls the bias circuit 53, the input switch 43, and the band selection switch 41 in accordance with the analog signals input from the digital circuit 47.

The circuit block constituting the digital circuit 47 overlaps the circuit block constituting the first amplifier circuit 51 in a plan view.

Figure 10B:
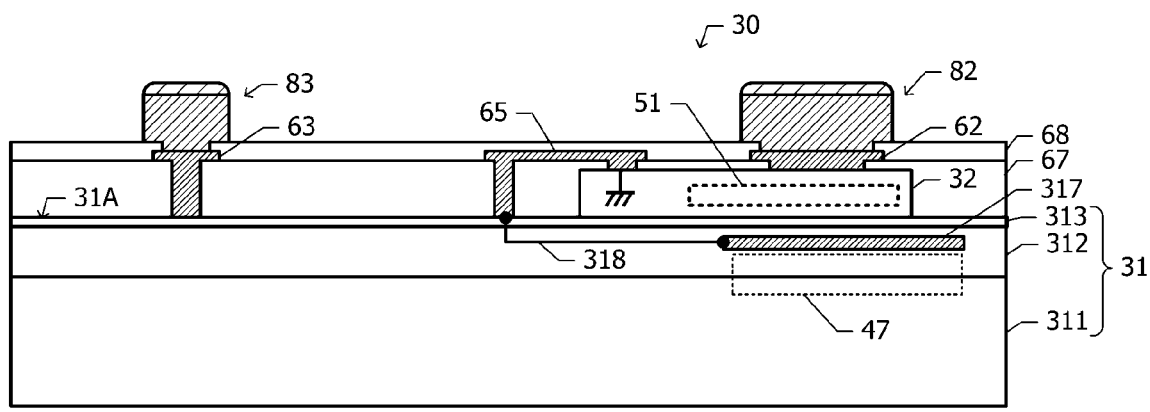
FIG. 10B is a schematic sectional view of the semiconductor device according to the third embodiment.

FIG. 10B is a schematic sectional view of the semiconductor device 30 according to the third embodiment. The digital circuit 47 is constituted by semiconductor elements formed in the surface layer portion of the substrate 311 of the first member 31 and by a plurality of wirings in the multilayer wiring structure 312. The first amplifier circuit 51 in the second member 32 overlaps the digital circuit 47 in a plan view. A metal film 317 is disposed between the circuit block constituting the first amplifier circuit 51 and the circuit block constituting the digital circuit 47. The metal film 317 is disposed, for example, in any of wiring layers in the multilayer wiring structure 312.

The metal film 317 is connected to the ground conductor in the second member 32 via a wiring 318 in the multilayer wiring structure 312 and a wiring 65 in the redistribution layer. Alternatively, the metal film 317 may be connected to the ground conductor in the second member 32 via a wiring in the module substrate. The metal film 317 functions as an electromagnetic shield conductor that electromagnetically shields the digital circuit 47 and the first amplifier circuit 51 from each other.

Advantageous effects of the third embodiment will be described below.

In the third embodiment, the digital circuit 47 and the first amplifier circuit 51 are shielded by the metal film 317 from each other. Therefore, even when the circuit block constituting the digital circuit 47 and the circuit block constituting the first amplifier circuit 51 are disposed to overlap in a plan view, electromagnetic interference is hard to occur therebetween. Accordingly, as in the first embodiment, the third embodiment can reduce the size of the semiconductor device 30 while reducing the influences caused by the electromagnetic interference between the circuit block in the first member 31 and the circuit block in the second member 32.

When a circuit block constituting an analog circuit in the first member 31 and the circuit block constituting the first amplifier circuit 51 are disposed to overlap in a plan view, an operating speed of the analog circuit is reduced due to a parasitic capacitance between the metal film 317 to which a ground potential is applied and the analog circuit. In the third embodiment, since the circuit block overlapping the metal film 317 in a plan view constitutes the digital circuit 47, a reduction in the operating speed of the analog circuit does not occur.

In order not to reduce an operating speed of the first amplifier circuit 51 in the second member 32, the metal film 317 held at the ground potential is preferably positioned away from the second member 32. For example, a gap between the metal film 317 and the second member 32 in a thickness direction is preferably set to be wider than a minimum value of gaps between the wirings in the multilayer wiring structure 312, those wirings forming the digital circuit 47, and the metal film 317 in the thickness direction.

Fourth Embodiment

A semiconductor device according to a fourth embodiment will be described below with reference to FIG. 11. In the following, description of a configuration common to that of the semiconductor device according to the first embodiment described above with reference to FIGS. 1 to 7D is omitted.

Figure 11:
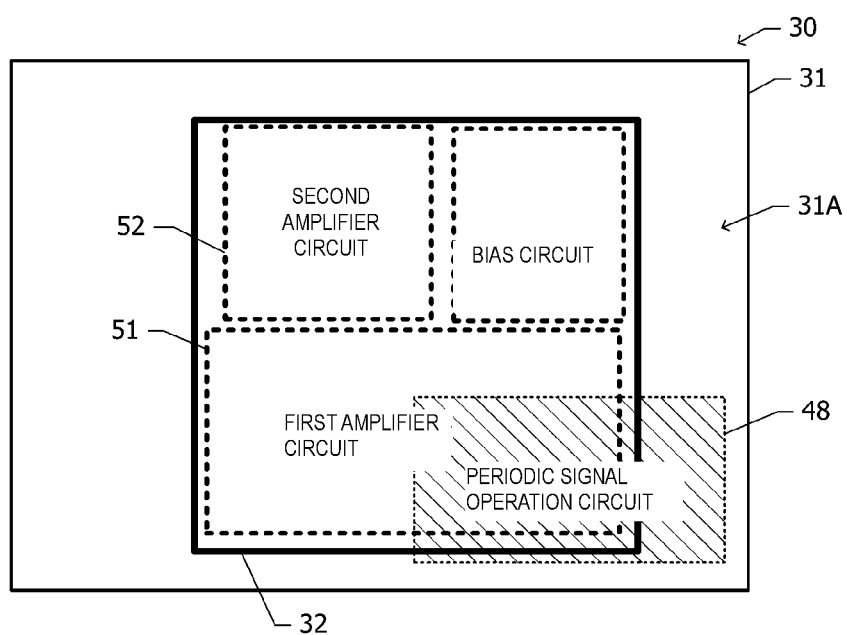
FIG. 11 is a schematic view illustrating an in-plane layout of circuit blocks when a first surface of a semiconductor device according to a fourth embodiment is viewed in plan.

FIG. 11 is a schematic view illustrating an in-plane layout of circuit blocks when the first surface 31A (FIG. 3) of the semiconductor device 30 according to the fourth embodiment is viewed in plan. In the fourth embodiment, a periodic signal operation circuit 48 is formed in the first member 31. In FIG. 11, a circuit block formed in the first member 31 is denoted by hatching with rightward declining lines. The circuit block constituting the first amplifier circuit 51 in the second member 32 overlaps the circuit block constituting the periodic signal operation circuit 48 in the first member 31 in a plan view. The periodic signal operation circuit 48 includes, for example, a digital circuit that operates in accordance with a clock signal changing periodically, and a charge pump circuit that performs a step-up operation by periodically repeating turning-on and -off of a switch.

The circuit block constituting the second amplifier circuit 52 in the second member 32 does not overlap any of the circuit blocks in the first member 31.

Advantageous effects of the fourth embodiment will be described below.

The periodic signal operation circuit 48 operating in accordance with the periodically changing signal is likely to generate spurious. The spurious generated from the periodic signal operation circuit 48 tends to couple to the circuit block in the second member 32, that circuit block overlapping the circuit block constituting the periodic signal operation circuit 48 in a plan view. Generally, a two-stage radio-frequency amplifier circuit is designed such that a high power output is obtained by increasing a gain of a first-stage amplifier circuit and by suppressing a gain of a final-stage amplifier circuit.

If the spurious is coupled to the second amplifier circuit 52 in the first stage, the spurious is amplified by the second amplifier circuit 52 with a higher gain and is further amplified by the first amplifier circuit 51. Therefore, a spurious component in an output signal of the first amplifier circuit 51 is increased. In the fourth embodiment, since the circuit block constituting the second amplifier circuit 52 does not overlap the circuit block constituting the periodic signal operation circuit 48 in a plan view, the spurious component can be avoided from being output after being amplified by both the second amplifier circuit 52 in the first stage and the first amplifier circuit 51 in the final stage.

Because the circuit block constituting the periodic signal operation circuit 48 overlaps the circuit block constituting the first amplifier circuit 51 in a plan view, the spurious generated from the periodic signal operation circuit 48 may be coupled to the first amplifier circuit 51 in some cases. A signal input to the first amplifier circuit 51 has a certain high signal level because the signal has been amplified by the second amplifier circuit 52. Therefore, even when the spurious is coupled to the first amplifier circuit 51, an influence of the spurious component upon the radio-frequency signal to be amplified is small. In addition, the spurious component coupled to the first amplifier circuit 51 is in no way amplified by the second amplifier circuit 52 in the first stage with the higher gain.

Thus, with the configuration of overlapping the circuit block constituting the first amplifier circuit 51 and the circuit block constituting the periodic signal operation circuit 48 in a plan view, the influence of the spurious can be reduced and the size of the semiconductor device 30 can be reduced.

A modification of the fourth embodiment will be described below.

Although, in the fourth embodiment, the circuit block constituting the periodic signal operation circuit 48 in the first member 31 overlaps the circuit block constituting the first amplifier circuit 51 in a plan view, another circuit block in the first member 31 may overlap the circuit block constituting the first amplifier circuit 51. Also in such a case, the circuit block constituting the second amplifier circuit 52 does not overlap any of the circuit blocks in the first member 31. In that configuration, even when noise generated from any of the circuit blocks in the first member 31 is coupled to the first amplifier circuit 51, an influence of a noise component upon the output signal is small. Hence, as in the fourth embodiment, the influence of the noise can be reduced, and the size of the semiconductor device 30 can be reduced.

Fifth Embodiment

A semiconductor device according to a fifth embodiment will be described below. In the following, description of a configuration common to that of the semiconductor device according to the first embodiment described above with reference to FIGS. 1 to 7D is omitted.

The first embodiment has been described in connection with the overlap between the circuit blocks in a plan view. The semiconductor device according to the fifth embodiment is featured by the overlap in a plan view not only between the circuit blocks, but also between wirings connecting the different circuit blocks.

Here, a broadly interpreted circuit block is assumed as a term including a circuit block constituting a certain circuit and a wiring directly connected to the circuit, the circuit block and the wirings being present in the same member. In the fifth embodiment, two broadly interpreted circuit blocks one of which includes a circuit in the first member 31 and the other of which includes a circuit in the second member 32, those circuits being directly connected to each other, overlap in a plan view.

For example, in the first embodiment, the circuit block constituting the input switch 43 and the circuit block constituting the second amplifier circuit 52, the input switch 43 and the second amplifier circuit 52 being electrically directly connected to each other, overlap in a plan view. On the other hand, in the fifth embodiment, at least one of the circuit block constituting the input switch 43 and the wiring directly connected to the input switch 43 and being present in the first member 31 overlaps, in a plan view, at least one of the circuit block constituting the second amplifier circuit 52 and the wiring directly connected to the second amplifier circuit 52 and being present in the second member 32.

Advantageous effects of the fifth embodiment will be described below.

As in the first embodiment, the fifth embodiment can also reduce the size of the semiconductor device 30 while reducing the influences caused by the electromagnetic interference between the two circuit blocks. In addition, the fifth embodiment can increase the flexibility in layout of the wirings.

A modification of the fifth embodiment will be described below.

In the fifth embodiment, the broadly interpreted circuit blocks one of which includes the circuit in the first member 31 and the other of which includes the circuit in the second member 32, those circuits being directly connected to each other, overlap in a plan view. In another configuration, as in the second embodiment, the broadly interpreted circuit block including the first amplifier circuit 51 may be disposed to overlap, in a plan view, one or more of the broadly interpreted circuit blocks in the first member 31, the one or more circuit blocks including circuits that are not operated during the operation of the first amplifier circuit 51. As in the third embodiment, the broadly interpreted circuit block including the digital circuit 47 and the broadly interpreted circuit block including the first amplifier circuit 51 may be disposed to overlap in a plan view, and the metal film may be disposed between both the broadly interpreted circuit blocks. As in the fourth embodiment, the broadly interpreted circuit block including the first amplifier circuit 51 and the broadly interpreted circuit block including the periodic signal operation circuit 48 may be disposed to overlap in a plan view.

Another modification of the fifth embodiment will be described below.

In the above-described fifth embodiment and modification thereof, the broadly interpreted circuit blocks including the circuits of which operations are less likely to be affected even with the occurrence of the electromagnetic interference are disposed to overlap in a plan view. In another configuration, the circuit block in the first member 31 and the wiring connected to any of the circuit blocks in the second member 32 may be disposed to overlap in a plan view. Alternatively, the circuit block in the second member 32 and the wiring connected to any of the circuit blocks in the first member 31 may be disposed to overlap in a plan view. The advantageous effects of reducing the size of the semiconductor device and improving the characteristics of heat dissipation can also be obtained with the above-mentioned cases. In addition, the flexibility in layout of the wirings can be increased.

The above-described embodiments are merely illustrative and, as a matter of course, partial replacement and combination of the features described in the different embodiments can be implemented. Similar operations and advantageous effects with similar features in the different embodiments are not described for each of the embodiments. Furthermore, the present disclosure is not limited to the above-described embodiments. It is apparent to those skilled in the art that, for example, various variations, modifications, combinations, and so on are also conceivable.

What is claimed is:

1. A semiconductor device comprising:
a first member having a first surface and including a plurality of circuit blocks disposed in an inner region of the first surface when the first surface is viewed in plan;
a second member joined to the first surface of the first member in surface contact with the first surface, the second member including one or more circuit blocks; and
a conductive protrusion protruding from the second member on an opposite side to the first member,
wherein one of the circuit blocks in the second member constitutes a first amplifier circuit including a plurality of first transistors that are connected in parallel to each other, and
at least one of the circuit blocks in the first member overlaps at least one circuit block in the second member in a plan view.

2. The semiconductor device according to claim 1, further comprising:
a wiring that connects the circuit block in the first member and the circuit block in the second member, the circuit block in the first member and the circuit block in the second member overlapping in a plan view.

3. The semiconductor device according to claim 1, wherein
the circuit block in the second member overlapping the circuit block in the first member in a plan view constitutes the first amplifier circuit, and
the circuit block constituting the first amplifier circuit overlaps one or more of the circuit blocks in the first member in a plan view, the one or more circuit blocks being not operated during operation of the first amplifier circuit.

4. The semiconductor device according to claim 1, wherein
the circuit block in the first member overlapping the circuit block in the second member in a plan view is a digital circuit, and
the first member includes a ground-connected metal film between the circuit block in the first member and the circuit block in the second member which overlap in a plan view.

5. The semiconductor device according to claim 1, wherein
the second member further includes a second amplifier circuit connected to a stage preceding the first amplifier circuit, and the circuit block in the second member overlapping the circuit block in the first member in a plan view constitutes the first amplifier circuit, and the circuit block constituting the second amplifier circuit does not overlap any of the circuit blocks in the first member in a plan view.

6. A semiconductor module comprising:
a first member having a first surface and including a plurality of circuit blocks disposed in an inner region of the first surface when the first surface is viewed in plan;
a second member joined to the first surface of the first member in surface contact with the first surface, the second member including one or more circuit blocks;
a first conductive protrusion protruding from the first surface of the first member;
a second conductive protrusion protruding from the second member in a same direction as the first conductive protrusion; and
a module substrate on which the first member and the second member are mounted,
wherein one of the circuit blocks in the second member constitutes a first amplifier circuit including a plurality of first transistors that are connected in parallel to each other,
at least one of the circuit blocks in the first member overlaps at least one circuit block in the second member in a plan view, and
the circuit block in the first member and the circuit block in the second member, which overlap in a plan view, are connected to each other via the first conductive protrusion, the second conductive protrusion, and a wiring disposed in or on the module substrate.

* * * * *